United States Patent
Mobin et al.

(10) Patent No.: US 7,312,667 B2
(45) Date of Patent: Dec. 25, 2007

(54) STATICALLY CONTROLLED CLOCK SOURCE GENERATOR FOR VCDL CLOCK PHASE TRIMMING

(75) Inventors: Mohammad S. Mobin, Orefield, PA (US); Gregory W. Sheets, Bangor, PA (US); Vladimir Sindalovsky, Perkasie, PA (US); Lane A. Smith, Easton, PA (US); Craig B. Ziemer, Fleetwood, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/221,316

(22) Filed: Sep. 7, 2005

(65) Prior Publication Data

US 2007/0052460 A1   Mar. 8, 2007

(51) Int. Cl.
*H03B 27/00* (2006.01)
(52) U.S. Cl. .................. 331/45; 331/57; 331/74; 327/156; 327/158; 327/159; 375/376
(58) Field of Classification Search .................. 331/45, 331/74, 57; 327/156, 158, 159; 375/376
See application file for complete search history.

(56) References Cited

U.S. PATENT DOCUMENTS 7,116,147 B2 *  10/2006  Kase .......................... 327/158

OTHER PUBLICATIONS

"Precision CMOS Receivers for VLSI Testing Applications" A Dissertation Submitted to the Department of Electrical Engineering and the Committee on Graduate Studies of Stanford University in Partial Fulfillment of the Requirements for the Degree of Doctor of Philosophy Daniel K. Weinlader—Nov. 2001.

* cited by examiner

*Primary Examiner*—Arnold Kinkead
(74) *Attorney, Agent, or Firm*—Synnestvedt & Lechner LLP

(57) ABSTRACT

The present invention addresses the generation of a controlled clock source for use in trimming VCDL delay line output clocks. In this trimming process, adjustments are made for static variations in these output clocks. The invention's use of a controlled clock source eliminates the need for this trimming process to be conducted in real time and reduces the expense of the circuitry required.

16 Claims, 4 Drawing Sheets

STATICALLY CONTROLLED CLOCK SOURCE GENERATOR FOR VCDL CLOCK PHASE TRIMMING

FIELD OF THE INVENTION

The present invention relates to clock delay adjustment circuitry. In particular, the present invention relates to the generation of a uniformly distributed multiphase clock.

BACKGROUND OF THE INVENTION

Various signal processing applications require the use of a multiphase clock in which clock signals are uniformly distributed in phase. FIG. 1 illustrates an example of the use of such a clock in a Clock Data Recovery (CDR) circuit. Contained in the overall CDR circuitry are essentially two loops, a first loop 130 in which phase locking to data occurs and a second loop 140 in which a multiphase clock is used to provide proper alignment of clock phases between 0° and 360°.

As depicted in FIG. 1, a reference clock signal 110 is supplied to a Voltage Controlled Delay Loop (VCDL) component 120. An internally available clock, derived from the reference clock 110, is used by a data sampling component 160 to oversample incoming data 150. Based on the results of this oversampled data, the internal clock is delayed so that it provides data sampling adjusted to the center of the "eye" pattern of the received serial data 150. FIG. 2 illustrates an example of sampling of a received digital data signal wherein $S_0$ and $S_1$ depict sampling times corresponding to the center of the eye pattern. Times $T_0$ and $T_1$, are transition points which are used by the system to determine these proper sampling times. In a VCDL system, phase of the sampling clock is constantly adjusted to keep up with phase deviations of incoming data.

One well-known problem in the prior art is the timing variations that occur within the second loop 140 itself that must be properly resolved before accurate data sampling is attained. There exist two components of these timing variations:

1. Static Variations:
   Static variations are due to static phase offsets resulting from clock edge placement errors. These errors are caused by fixed error sources such as (a) semiconductor device fabrication variations, (b) circuit mismatches and (c) layout asymmetries.
2. Dynamic Variations:
   The dynamic variations are due to deterministic jitter, random jitter, or periodic jitter.

Static variations are due to physical mismatches. Such variations are a significant source of timing errors that are conventionally addressed with a calibration process. The position of the clock edges are measured with averaged phase timing measurements using histogram counters. The resulting histogram of these count values indicates the variation of the clock phases. The mitigation of these variations, or clock phase trimming, is performed by equalizing the histogram count values. In particular, this mitigation is typically performed by tuning adjustable tail currents within the clock buffers.

One example of such a histogram technique is described in a November 2001 Stanford dissertation thesis entitled "PRECISION CMOS RECEIVERS FOR VLSI TESTING APPLICATIONS" by Daniel K. Weinlader, said thesis hereby incorporated by reference in its entirety. In Weinlader's process, as in other conventional techniques, the trimming process has to be performed in real time and accordingly, the following components are typically required:
   (a) a controlled ppm (part per million) generator,
   (b) a high speed phase comparator,
   (c) a high speed counter and
   (d) complex histogram processor.

As a result, this solution is expensive and can not be practically implemented in many commercial products.

SUMMARY OF THE INVENTION

The present invention relates to the generation of a statically controlled clock source for use in trimming VCDL delay line output clocks. This controlled clock source replaces the need for an expensive ppm generator as required with previous trimming methods. Further, the static nature of the clock source eliminates the previous requirement of having to perform this trimming process in real time.

The present invention uses a clock source whose phase is adjusted in a controlled fashion. One embodiment of the present invention uses an array of flip-flops (FF), one FF for each phase of the multiphase clock to be trimmed. In particular, each of the phases is supplied to the CK input of one of these FFs. The controlled clock is supplied to the D input of each FF. The phase of the controlled clock source can be moved earlier or later in a controlled manner using an interpolator. In this manner the invention creates a static input that can be varied.

The phase of the controlled clock source is varied until it crosses one of the CLK phases of the multiphase clock generator. The phase of the controlled clock source at this instant is recorded. This process occurs for each of the other phases of the multiphase clock generator. Adjustments are then performed to evenly distribute the phases of the multiphase clock.

Other objects, features, and advantages of the present invention will be apparent from the accompanying drawings, and from the detailed description which follows below.

BRIEF DESCRIPTION OF THE DRAWINGS

Various embodiments of the present invention will now be described in detail in conjunction with the annexed drawings, in which.

DETAILED DESCRIPTION

Figure 1:
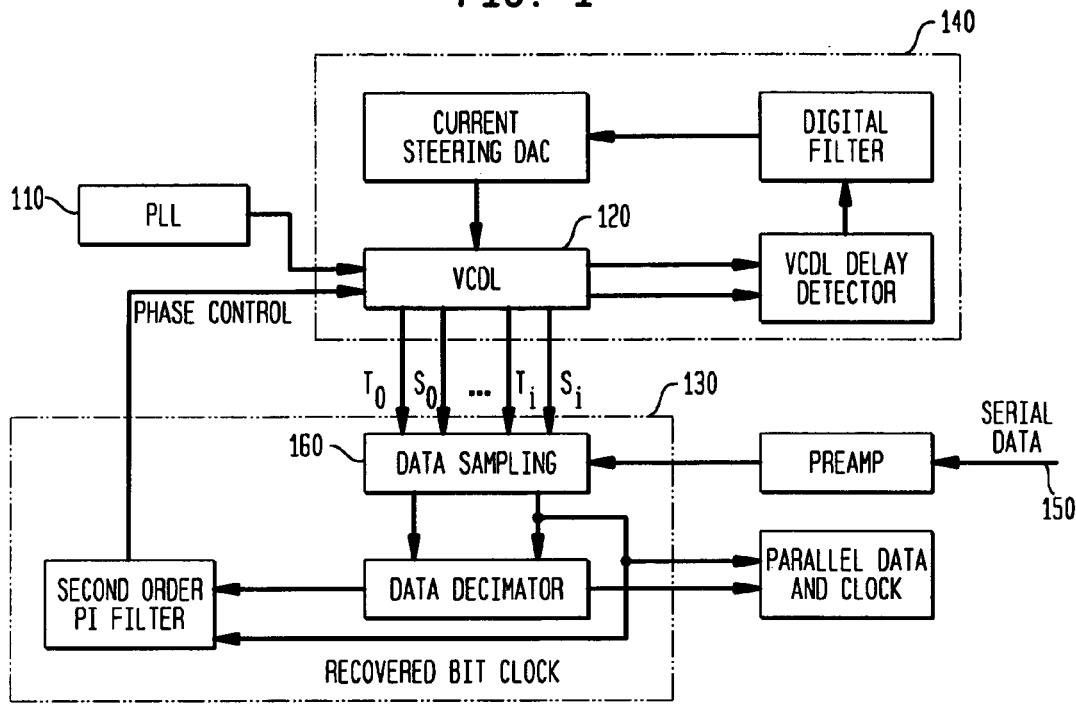
FIG. 1 is a block diagram of a CDR circuit.
Figure 2:
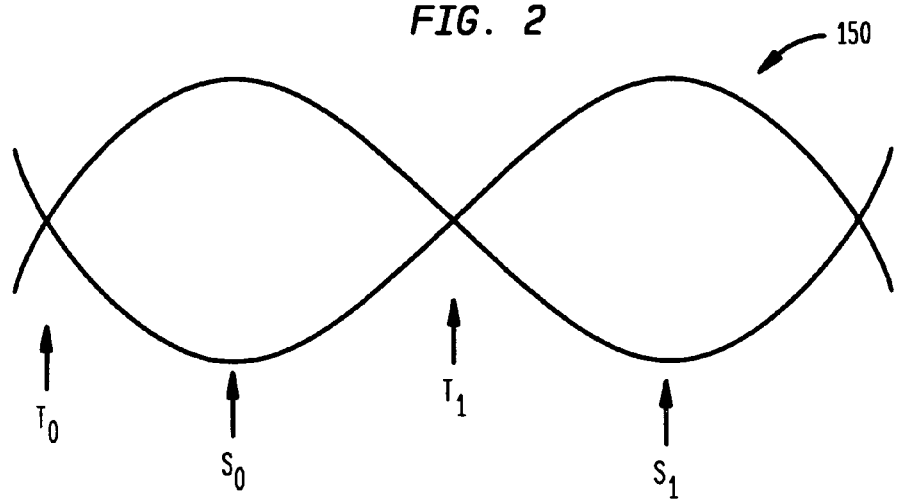
FIG. 2 depicts sampling times corresponding to the center of the eye pattern of a received serial data signal.
Figure 3:
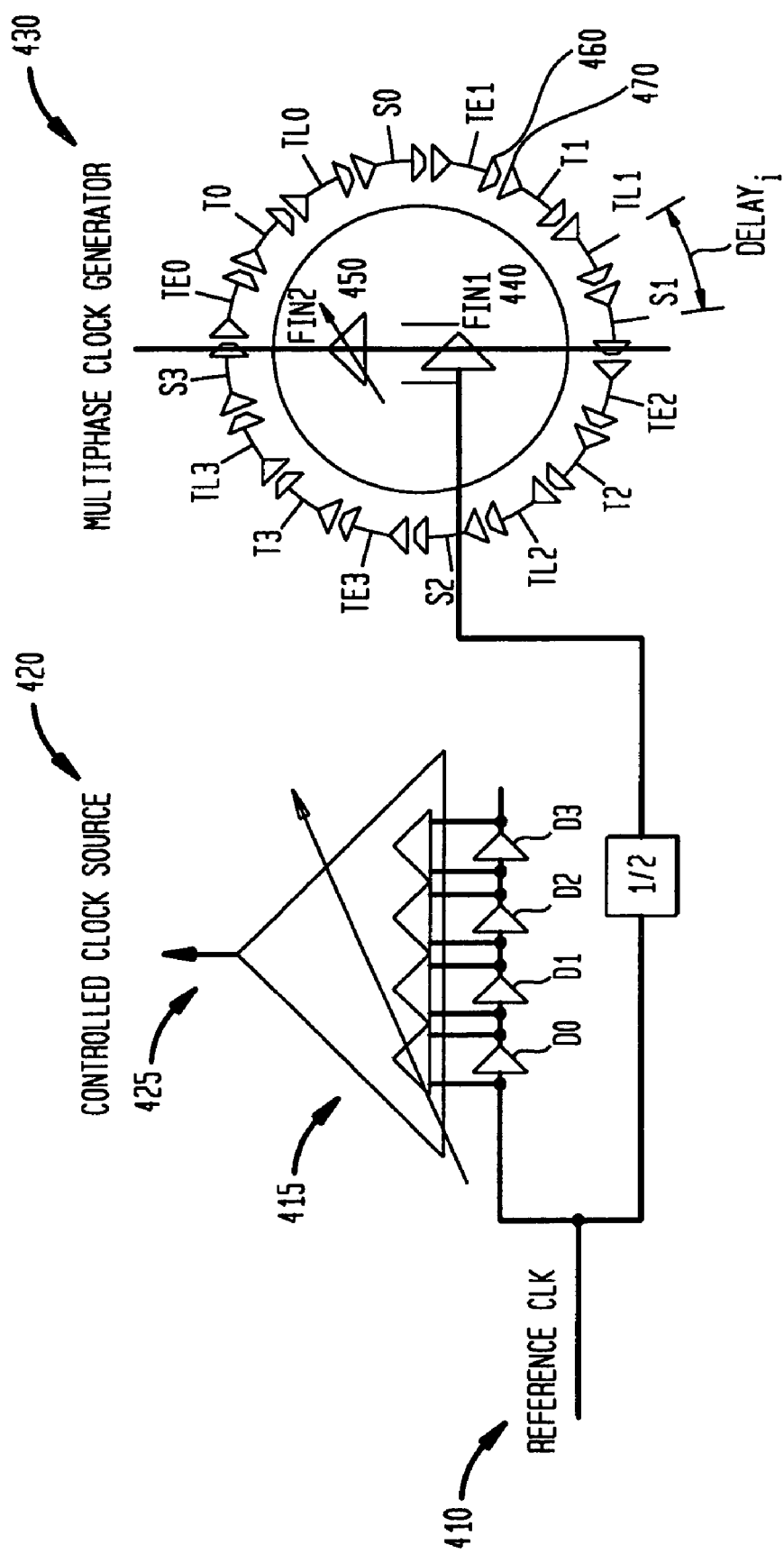
FIG. 3 is a block diagram illustrating an embodiment of the invention having two major components, a controlled clock source and a multiphase clock generator.

FIG. 3 illustrates a simple example of a multiphase clock generator in which 16 phases are generated: TE0, T0, TL0, S0, ... TL3 and S3. The present invention performs adjustments for static variations that occur in this generator process so that the phases of the resulting clocks are evenly distributed. That is, each Delay$_i$ is essentially equal. This adjustment process shall be referred to throughout this application as clock trimming.

FIG. 3 illustrates an embodiment of the invention in which a Reference CLK signal 410 is supplied to both a controlled multicycle clock source component 420 and a multiphase clock generator 430. The controlled clock source 420 component comprises a series of delay elements ($D_0$, $D_1$, $D_2$ and $D_3$). Each of these delay elements yields a 90° phase shift. The Reference CLK signal 410, as well as the outputs of the delay elements, is connected to a variable interpolator 415 which, as is well-known in the industry, results in creating smaller incremental phase shifts. In an embodiment of the invention, 64 such incremental shifts are provided by the variable interpolator for each 90° quadrant, yielding a total of 256 phase shifts. Each of these potential phase shifts is assigned an interpolation code of the form Quadrant (Q0-Q3)/Interpolator Number (0-63), corresponding to the delay element and incremental shift involved. One of these 256 clock signals is determined and outputted from the controlled clock source 420 on line 425.

As illustrated in FIG. 3, the multiphase clock generator contains a multiplexer 460 and a delay element 470 associated with each of the clock phases that are generated. The injection point of the reference clock signal 410 is supplied through 440 to the appropriate multiplexer, as is well known in the art.

Figure 4A:
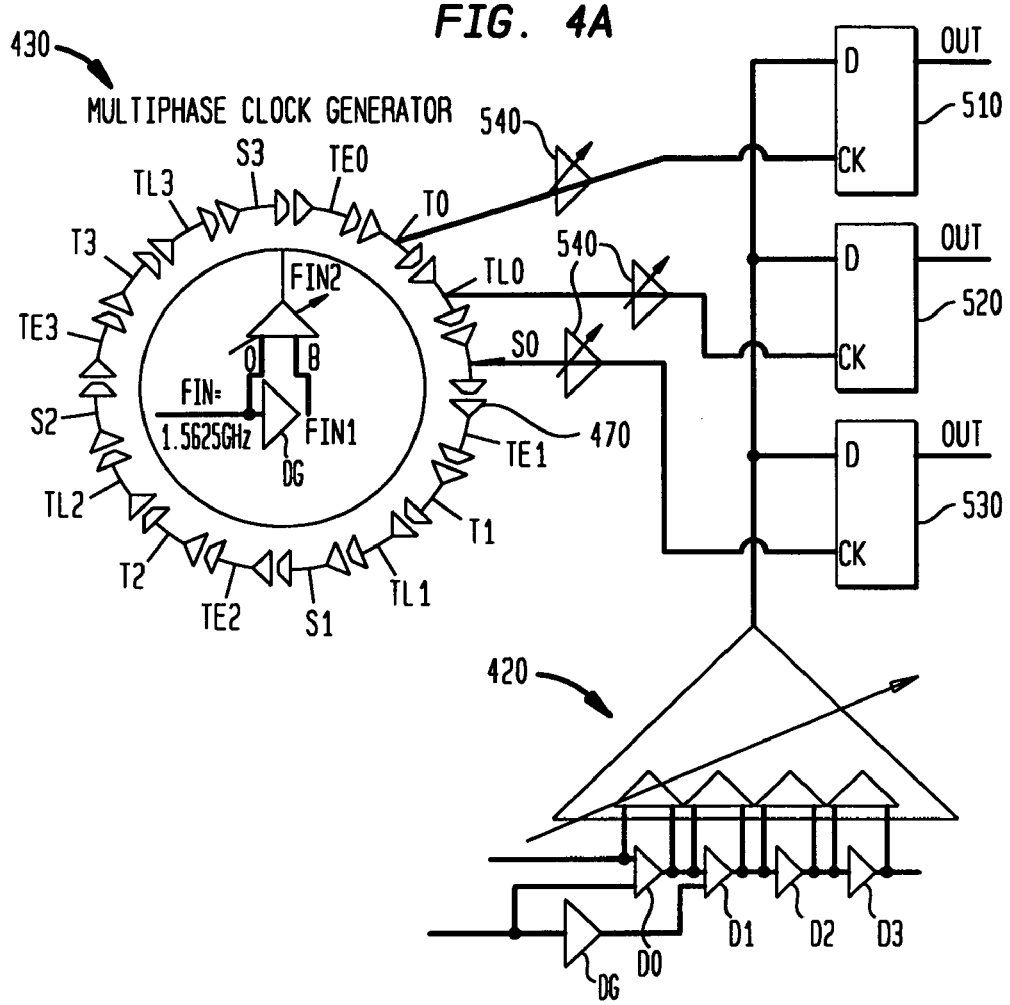
FIGS. 4A is a block diagram & 4B is a timing diagram illustrating a further embodiment of the invention by which a series of FFs are combined with a controlled clock signal to perform clock trimming of the multiphase clock generator; and, FIG. 5 illustrates an exemplary multiphase clock whose four phases have been measured relative to the controlled clock signal by an embodiment of the invention.
Figure 4B:
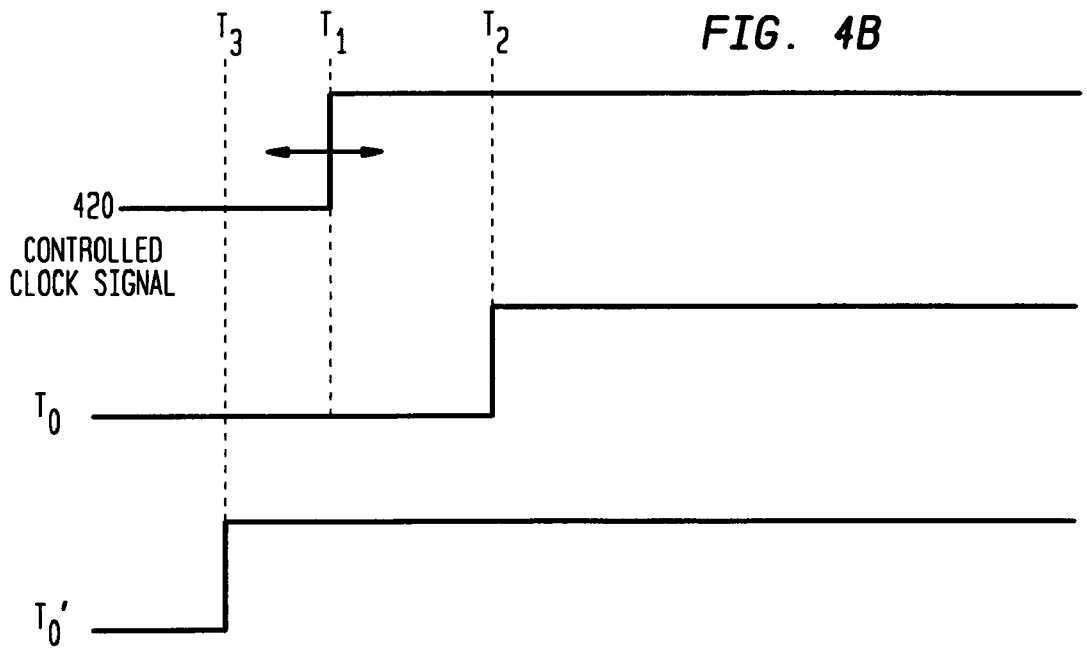

A feature of the present invention is the use of a FF arrangement to evenly distribute the clock phases. FIGS. 4A & 4B illustrate this principle where each phase of the multiphase clock 430 is supplied to the CK input of a FF (510, 520, 530 . . . ). The D input to each FF is supplied from the controlled clock source 420. In a situation where the controlled clock phase lags behind the multiphase clock supplied to a particular FF, the latch will register 0 when the clock signal triggers that FF. By supplying that FF with a series of controlled clock timing signals, each advancing slightly in phase, at some point the output of that FF will change from a 0 to a 1. At this point the controlled clock source is in phase with the particular phase of the multiphase clock supplied to that FF.

By way of example, T0 is depicted as being connected to the CK input of FF 510. As illustrated in FIG. 4B, the phase of T0 is such that its rising edge occurs at $t_2$. In this illustrated example, the rising edge of the controlled clock signal initially occurs at $t_1$. In the process of trimming multiphase clock 430, incrementally advancing controlled clock source outputs are supplied to the D input of FF 510. When the output of the FF changes from a 0 to a 1 at time $t_2$, T0 is in phase with the controlled clock signal 420. The interpolation code of the controlled clock associated with time $t_2$ is then recorded for T0. In this manner the phase shift of T0 relative to the reference clock 410 is quantified by the interpolation code at $t_2$ (i.e. the delay elements employed and the incremental delay used in generating the controlled clock signal at $t_2$).

In an alternative situation the phase of clock signal may initially lag behind the controlled clock signal 420 at time $t_1$. This is illustrated as signal T0' in FIG. 4B. In this example FF 510 would output a 1 at time $t_1$ due to the phase of T0' relative to the controlled clock signal 420. In this situation, the phase of the controlled clock would be incrementally moved in the direction of $t_3$, at which time the output of FF 530 would change from a 1 to a 0. As before, the interpolation code of the controlled clock signal 420 at time $t_3$ would be recorded.

Figure 5:
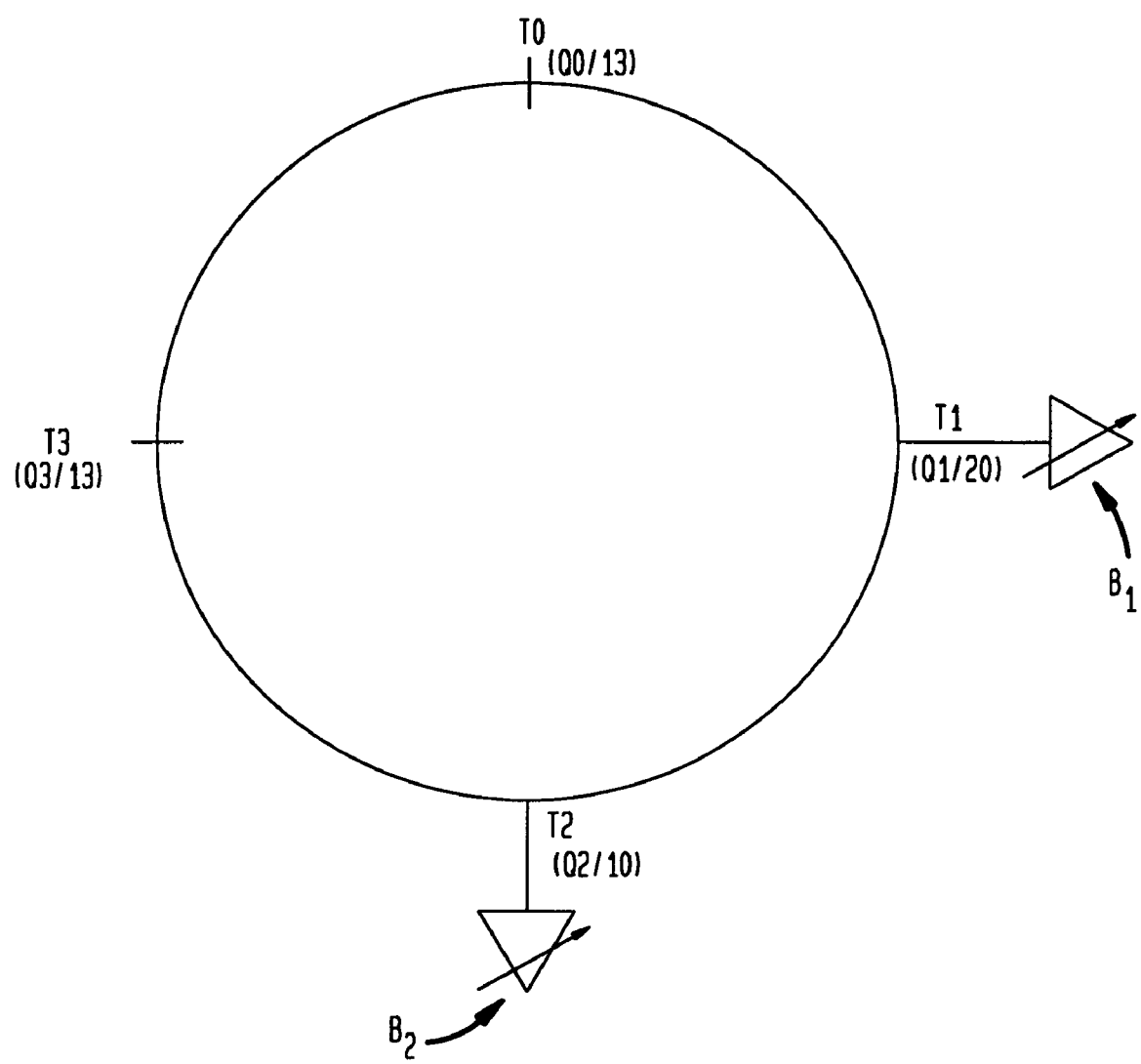

In this manner the phase of each of the 16 generated sample clocks of the multiphase clock generator 430 is determined relative to the controlled clock signal and the corresponding interpolation codes are noted. Once an interpolation code has been assigned for each of the phases of the multiphase clock, the delays associated with these phases are then adjusted in an effort to make them evenly distributed. FIG. 5 illustrates an example in which only four phases are illustrated to simplify the following explanation. As depicted, phase clocks T0, T1, T2 and T3 were evaluated using the procedure depicted in FIGS. 4A & 4B, yielding interpolation codes Q0/13, Q1/20, Q2/10 and Q3/13, respectively. Each of the sampling clocks contains a buffer (e.g., $B_1$ and $B_2$; such buffers having previously been illustrated as item 540 in FIG. 4A). These buffers are now adjusted in an effort to set each of these clock phases an equal distance apart (i.e., 90° in this example having 4 clock phases).

Various algorithms are contemplated by the invention to perform this buffer trimming. In one embodiment, one clock phase may be held fixed and the others adjusted to it. Using the specific numbers of the example above, this may be implemented by T0 being fixed. As T1 was determined to be greater than 90° (Q1/13 would be exactly 90°), the delay associated with T1's buffer $B_1$ needs to be decreased. This adjustment to buffer $B_1$ is done in an effort to have the next iteration of the FF procedure result in the T1's interpolation code being "reduced" to Q1/13). Correspondingly, the delay of buffer B2 (corresponding to clock T2) would be increased. As T3's phase already has a 90° separation from T0, no adjustments are required to its buffer. Various mechanisms for adjusting buffer delays are well known in the art (e.g., changing buffer gain factors and/or adjusting threshold values).

In a further embodiment of the invention, once the buffer adjustments are performed, the procedure is repeated. Further adjustments are then performed if warranted. Iterations are performed in this manner until the multiphase clock generator's phases are trimmed so that they are equally spaced apart. Additional embodiments of this procedure may terminate the iterative procedure when required tolerances are met (e.g. 5 ps) and/or the minimum phase step adjustment yields no further improvement.

As noted above, alternative embodiments of the invention permit alternative trimming algorithms once the interpolation codes have been determined. An additional example would be one in which a "numerical average" of interpolation codes is derived and each phase clock is adjusted in an effort to attain that average value. This algorithm first sets one of the determined codes as a base or 0 value, determines code values for the remaining phases relative to that base value, and then computes and uses the average value to perform the trimming adjustments. Again using the numerical interpolation codes of FIG. 5 as an example, letting T0 be the base value, T1 would then correspond to +7, T2 would be a −3, and T3 would be a 0. The numerical average of these values would yield 4/4 or 1. Each of the phase clock buffers would be adjusted accordingly. That is, buffers for T0 and T3 would be increased slightly (in an effort to attain a +1 interpolation code change in the next iteration). Similarly, clock phase T1 would need to be decreased by 6 and clock phase T2 would need to be increased by 4 (to be properly adjusted relative to reference T0's "new Q0/14" interpolator code). It is clear that in this algorithm, the use of an average has the advantage in that the maximum trimming required for any one phase clock is reduced.

It should be noted that in alternative embodiments of the invention, the trimming process can be performed by adjustments to the delay element 470 associated with the clock phase rather than to buffer 540. In still further embodiments, adjustments to both the appropriate buffer 540 and the delay element 470 are made in performing the trimming process.

As noted above, one embodiment of the invention mitigates static timing variations (e.g. those caused by semiconductor device fabrication variations, circuit mismatches and layout asymmetries). Accordingly, phase trimming adjustments to compensate for these variations need not occur continuously. By way of example, the invention's trimming process may be performed at the time the multiphase clock generator is powered up. Additionally, such trimming may occur as a periodically scheduled event.

While the invention has been described with reference to the preferred embodiment thereof, it will be appreciated by those of ordinary skill in the art that modifications can be made to the structure and elements of the invention without departing from the spirit and scope of the invention as a whole. In particular, it should be noted that while the invention has been described above with respect to a VCDL circuit, it is applicable to the trimming of any multiple clock device having phase separations and appropriate phase adjustment controls.

What is claimed is:

1. A clock alignment circuit for aligning a plurality of clocks generated by a clock generator, the plurality of clocks having the same frequency as a reference clock and separated in phase from each other; the clock alignment circuit comprising:
    a controlled multicycle clock source producing a clock signal having a static phase shift relative to the reference clock, wherein said static phase shift can be varied in a controlled manner;
    a phase comparator circuit for utilizing the controlled multicycle clock source clock signal to detect the phase of at least two of said plurality of clocks relative to the reference clock;
    a control circuit for adjusting the phase of at least one of the plurality of generated clocks.

2. The clock alignment circuit of claim 1 wherein the generated clocks are VCDL delay line output clocks and wherein the control circuit adjusts the phases of the generated clocks so that they are separated evenly.

3. The clock alignment circuit of claim 1 wherein the controlled multicycle clock source comprises:
    a reference clock source input;
    a series of delay elements; and,
    an interpolator, capable of producing incremental phase shifts;
    wherein the static phase shift relative to the reference clock is produced by employing a number of delay elements and incremental phase shifts, and wherein said static phase shift is quantified by the number of delay elements and the incremental phase shifts employed.

4. The clock alignment circuit of claim 3 wherein the phase comparator comprises:
    an array of flip-flops (FF), one FF for each of said plurality of clocks, each FF having a D input and a CK input;
    wherein the CK input of each FF is connected to one of said plurality of generated clocks and the controlled clock signal is supplied to the D input of each FF.

5. The clock alignment circuit of claim 4 wherein the control circuit comprises a clock phase adjustment means selected from the group consisting of sampling clock buffer adjustment means, clock delay element adjustment means, and combinations thereof.

6. A method for aligning a plurality of clocks generated by a clock generator, the plurality of clocks having the same frequency as a reference clock and separated in phase from each other; the method comprising:
    producing a controlled multicycle clock signal having a static phase shift relative to the reference clock, wherein said static phase shift can be varied in a controlled manner;
    utilizing the controlled multicycle clock signal to detect the phase of at least two of said plurality of generated clocks relative to the reference clock;
    adjusting the phase of at least one of the plurality of generated clocks.

7. The method of claim 6 wherein the generated clocks are VCDL delay line output clocks and wherein said adjusting step comprises adjusting the phases of the generated clocks so that they are separated evenly.

8. The method of claim 6 wherein said producing step comprises:
    creating the static phase shift by using a number of delay elements in combination with an incremental shift generated by a variable interpolator.

9. The method of claim 8 wherein said number of delay elements is four delay elements, each fielding a 90° phase shift and wherein said variable interpolator generates 256 incremental phase shifts.

10. The method of claim 8 wherein each static phase shift relative to the reference clock is quantified by the number of delay elements employed and the incremental delay used in creating the static phase shift.

11. The method of claim 10 wherein said utilizing step comprises:
    incrementally adjusting the phase of the controlled multicycle clock signal to bring it in phase with one of said plurality of generated clocks; and,
    noting the corresponding quantified static phase shift.

12. The method of claim 11 wherein said utilizing step further comprises repeating said incrementally adjusting step and said noting step to obtain quantified static phase shift data for each of said plurality of generated clocks.

13. The method of claim 12 wherein said adjusting step comprises utilizing the quantified static phase shift data for each of said plurality of generated clocks to adjust the phases of the plurality of clocks relative to each other.

14. The method of claim 13 wherein at least one additional iteration of the detecting and adjusting steps are performed.

15. The method of claim 13 wherein the method is performed at the time the clock generator is powered up.

16. The method of claim 13 wherein the method is performed at scheduled intervals.

* * * * *